United States Patent [19]

Flint et al.

[11] 4,101,763
[45] Jul. 18, 1978

[54] CONTROL SYSTEM FOR AN IMAGE DETECTOR

[75] Inventors: John R. Flint, Barrington; K. George Rabindran, Lincolnwood, both of Ill.

[73] Assignee: Bell & Howell Company, Chicago, Ill.

[21] Appl. No.: 803,019

[22] Filed: Jun. 3, 1977

[51] Int. Cl.² ............................................. H01J 39/12
[52] U.S. Cl. ............................ 250/214 R; 250/214 C; 328/147; 328/151; 307/290; 307/311; 307/351; 307/360
[58] Field of Search ......................... 250/214 R, 214 C

[56] References Cited

U.S. PATENT DOCUMENTS 3,821,547  6/1974  Shenk ................................. 250/214 P Primary Examiner—David C. Nelms
Assistant Examiner—Michael J. Tokar
Attorney, Agent, or Firm—Harry G. Thibault; Alan B. Samlan

[57] ABSTRACT

A control system is described for converting the output current of a photosensitive image detector to an image location voltage of predetermined first and second levels in response to the image detector receiving high and low levels of light, respectively. The image location voltage is developed by passing the output current from the image detector, as well as a selectively variable control current, through an impedance such that increases and decreases in the amplitude of the control current result in corresponding decreases and increases, respectively, in the level of the image location voltage. To change the level of the image location voltage, the amplitude of the control current is caused to be proportional to the charge on a charge storing element and the latter is rapidly and alternately charged and discharged within predetermined limits to vary the amplitude of the control current, and thus the level of the image location voltage. By so varying the charge on the charge storing element, the image location voltage is caused to have an average value which is substantially equal to the first predetermined level when the image detector receives a relatively high level of light, and an average value which is substantially equal to the second predetermined level when the image detector receives a relatively low level of light.

14 Claims, 4 Drawing Figures

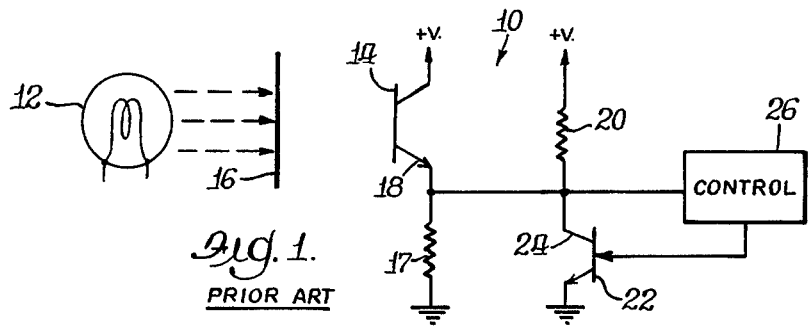
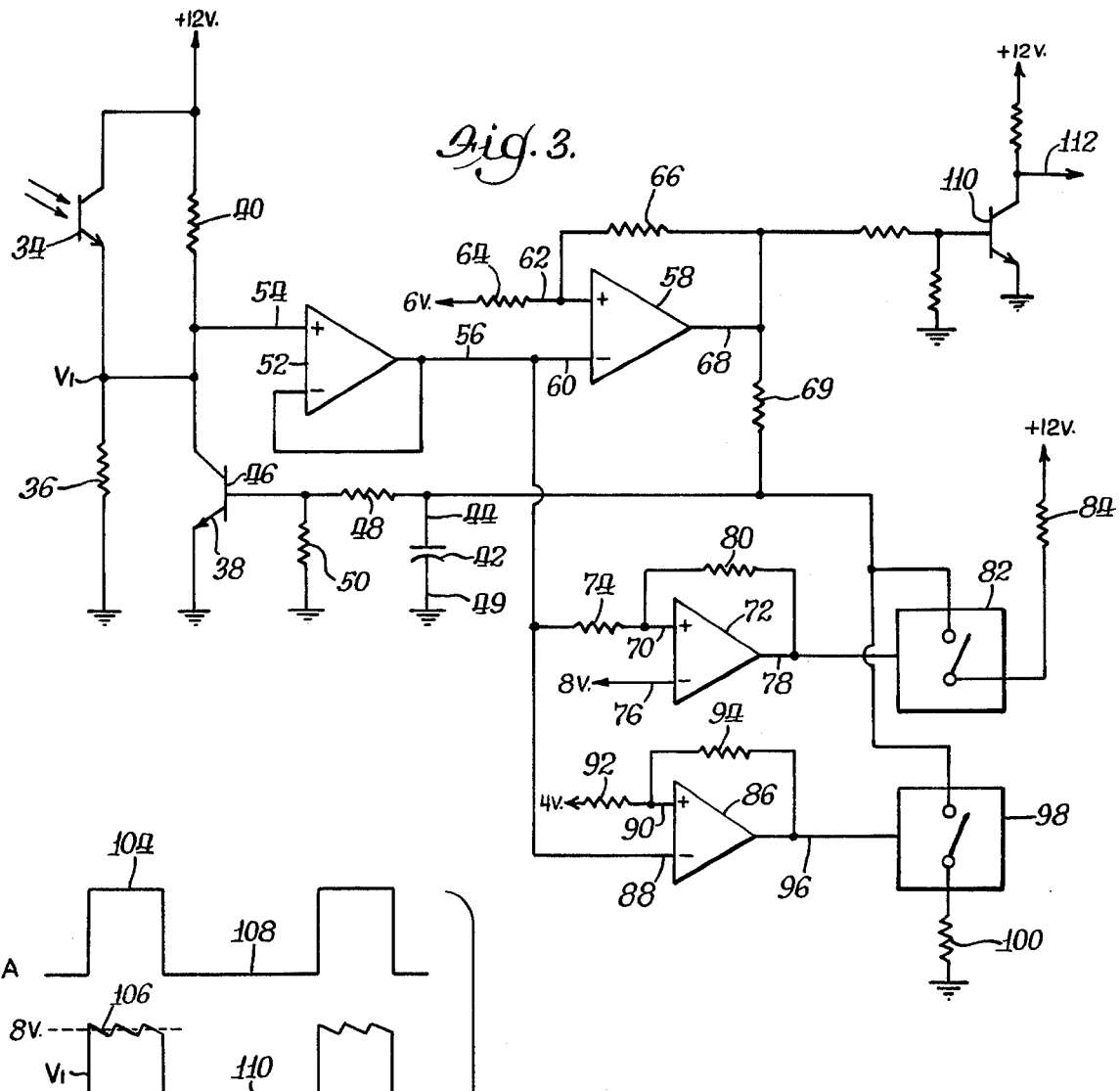
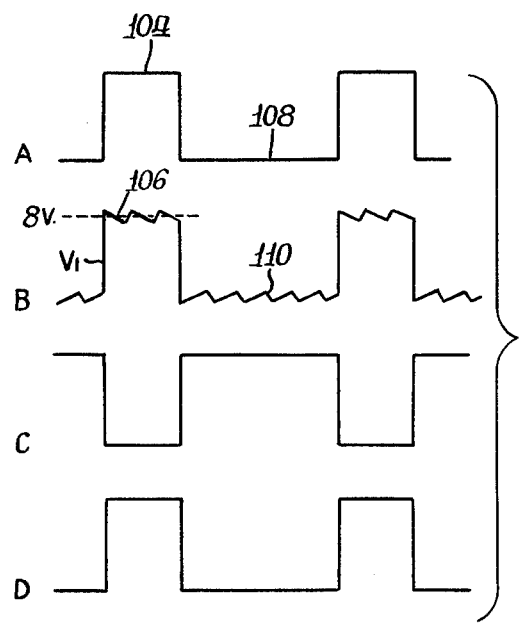
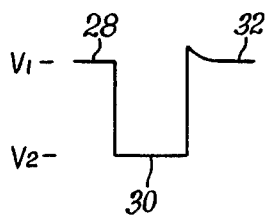

CONTROL SYSTEM FOR AN IMAGE DETECTOR

BACKGROUND OF THE INVENTION

This invention relates generally to object detectors and particularly to detectors for sensing the presence and absence of documents, images or microfilm, and the like.

In the past, document detectors have been provided for sensing the presence of a document as it passes between a light source and a photosensitive device. The interruption of the light by the document results in a change in the light received by the photosensitive device and a corresponding change in the flow of current therein. Typically, the change in the flow of current through the photosensitive device has been converted to a voltage change for developing a pulse indicative of the presence of a document. The number of pulses can then be counted to determine the number of documents which pass the detector. Similar systems operate by sensing the light reflected by a document as it passes along a document path adjacent the photosensitive device.

A problem which has been addressed and solved by a prior document detector is that of maintaining the voltage which is derived from the current output of the photosensitive device at a known and constant level under the condition existing when no document is passing the detector, regardless of long term drifts in the output of the light source, changes in the characteristics of the photosensitive device, or the like. Thus, despite any long term change in the current flowing in the photosensitive device, the voltage derived from that current, referred to herein as the image location voltage, is held at a known reference level, typically by a feedback loop. Accordingly, only the abrupt and substantial change in the flow of current in the photosensitive device which occurs when a document passes the detector results in a change in the image location voltage and only then is an indication generated of the passage of a document past the detector.

Although prior detectors do reliably accommodate long term drifts in the system to establish the image location voltage at a constant reference level as an indication that no document is being detected, they rely merely on a large change in the level of the image location voltage as an indication of the presence of a document. Such prior detectors are, however, incapable of maintaining the image location voltage at a second predetermined reference level in the presence of a document. Consequently, the latter level of the image location voltage is subject to change. For example, should a document remain in the detector and interrupt the light source for an indefinite period of time, the level of the image location voltage may change with drifts in the characteristics of the light source or the photosensitive device. The resulting indefiniteness in the level of the reference voltage under this latter condition is particularly disadvantageous in systems such as microfilm readers in which a microfilm bearing images is advanced past the light source for generating a pulse each time an image interrupts the light source. Frequently, the film may be stopped for an indefinite time at a point where the light source is interrupted by an image. Under this condition, it is desirable that the detector be able to hold the image location voltage at a predetermined level as long as the image interrupts the light source, regardless of any drifts in the system or gradual changes in ambient light, in order to generate a positive indication that an image is being detected. Of course, it is also required that the image location voltage be held at another predetermined reference level when no image is interrupting the light source. Detectors which maintain a constant reference voltage level only under one of the two conditions which are frequently encountered in microfilm readers, i.e. the indefinite absence or presence of an image, are, accordingly, subject to developing an indeterminate output when a document or image remains detected for a prolonged duration.

Accordingly, it is an object of this invention to provide an improved control system for an image detector.

It is a more specific object of this invention to provide a control system which maintains the image location voltage at a first predetermined reference level under the condition of prolonged presence of an image and at a second predetermined reference level under the condition of prolonged absence of an image, despite long term changes in ambient conditions or detector component values.

BRIEF DESCRIPTION OF THE DRAWINGS

These and other objects of the invention are more particularly set forth in the following detailed description and in the accompanying drawings of which:

FIG. 1 is a schematic representation of a prior image detector;

FIG. 2 is an illustration of the waveform useful in describing the operation of the detector illustrated in FIG. 1;

FIG. 3 is a schematic illustration of a control system for an image detector embodying various aspects of the invention; and FIG. 4 illustrates four waveforms useful in describing the operation of the control system shown in FIG. 3.

DESCRIPTION OF THE PREFERRED EMBODIMENT

Broadly stated, the control system described herein converts the current generated by a photosensitive device to a voltage, referred to herein as the image location voltage, and operates on that voltage so as to maintain it at a first or high predetermined voltage level when the photosensitive device receives a relatively high level of light and at a second or low predetermined voltage level when the photosensitive device receives a relatively low level of light. To control the level of the image location voltage, the output of a variable current source is coupled to an impedance, the latter impedance also receiving the current output of the photosensitive device. Accordingly, the level of the image location voltage is a function both of the level of current supplied by the photosensitive device and the level of current supplied by the current source. The current supplied by the current source, and thus also the level of the image location voltage, is varied in proportion to the level of charge on a charge storing device, such as a capacitor. Means are included for detecting when the image location voltage is between the first predetermined level and a selected lower level intermediate the first and second predetermined levels. When this condition occurs, the charge storing element is discharged until the image location voltage exceeds the first predetermined level, after which the charge storing element is alternately charged and discharged so as to drive the image location voltage alternately above and below the first predetermined voltage level to maintain the average image location voltage substantially equal to the first predetermined voltage level.

The same detecting means also detects when the image location voltage drops below the selected lower level, as when the light incident on the photoelectric device is substantially reduced. When this condition occurs, the charge storing element is charged until the image location voltage drops below the second predetermined level after which the charge storing element is alternately discharged and charged so as to drive the image location voltage alternately above and below the second predetermined voltage level to maintain the average level of the image location voltage substantially equal to the second predetermined voltage level.

The significance of the operation of the control system described herein is best explained by a brief discussion of the operation of a prior image detector, as shown very schematically in FIG. 1. It is to be understood that the phase "image detector" is used herein in a generic sense to include document detectors, detectors for sensing images on microfilm, and the like.

Referring now to FIG. 1, there is shown a prior image detector 10 in which a light source 12 directs light toward the base of a photosensitive transistor 14. A document 16 is shown interrupting the light path between the light source 12 and the transistor 14. Under this condition, the current developed by the transistor 14 is minimum. When the document 16 is conveyed to a location where it no longer interrupts the light from the light source 10, the light impinges on the transistor 14, as a result of which transistor 14 generates a high level of current.

In order to convert the current generated by transistor 14 to a voltage, a resistor 17 is coupled from the emitter 18 of transistor 14 to ground. The voltage at the emitter 18 is the voltage referred to herein as the "image location voltage" because its level is indicative of the absence or presence of a document between the light source 12 and the transistor 14.

To fix the image location voltage to a known predetermined level when no document is present, the detector 10 includes a resistor 20 coupled between the emitter 18 and a positive voltage source, a transistor 22 having a collector 24 coupled to the junction of the emitter 18 and the resistor 20, and a control system 26 connected as shown for selectively varying the current generated by the transistor 22 for fixing the image location voltage at the desired level.

A more complete illustration and description of the detector 10 is given in U.S. application Ser. No. 644,798, filed Dec. 29, 1975 and now Pat. No. 4,027,154, and assigned to the assignee of the present application. Suffice it to say that the control 26 operates to maintain the image location voltage at a predetermined level under the condition when the photosensitive transistor is receiving a maximum amount of light. For example, the voltage waveform shown in FIG. 2 represents the image location voltage prior to, during, and after a document has traversed the light path. The portion 28 of the waveform indicates the level of the image location voltage prior to a document traversing the light path, the portion 30 indicates the voltage level when a document is in the light path, and portion 32 indicates the voltage level when the document has left the light path.

By virtue of the operation of the control 26, the level of the image location voltage, indicated by portions 28 and 32 of the waveform of FIG. 2, is caused to be fixed to the level $V_1$. The level $V_2$ is, however, not fixed and is subject to change due to changing component values, ambient conditions etc. Should a document remain in the light path for an indefinite duration, the level $V_2$ may vary. Consequently, the image location voltage may give an indefinite indication of the condition of the light path.

An image detector and a control system therefor which gives a positive indication under both possible conditions, i.e., a document (or image) present in the light path and a document (or image) absent from the light path is shown schematically in FIG. 3.

As shown, the image detector includes a conventional photosensitive device in the form of a transistor 34 which develops a current proportional to the level of light incident thereon. The current developed by the transistor 34 is converted to an image location voltage $V_1$ by coupling a resistor 36 between the emitter of the transistor 34 and ground.

Controlled variation in the level of the image location voltage $V_1$ is effected by coupling a variable current source, shown as a transistor 38, to the junction between the resistor 36 and the emitter of the transistor 34. At the junction, a resistor 40 is coupled to a 12 volt voltage source. Consequently, the current through the impedance comprising the resistors 36 and 40 and thus the voltage $V_1$, is a function of the current generated by the transistors 34 and 38.

The circuitry thus far described with reference to FIG. 3 is conventional. Most of the remainder of the circuitry of FIG. 3, however, comprises one form of a novel control system for controlling the current generated by the transistor 38 such that the image location voltage $V_1$ is fixed between a predetermined first or high voltage level and a predetermined second or low voltage level. Such control over the conduction of the transistor 38 is generally effected by first sensing the level of the voltage $V_1$ to determine whether the transistor 34 is receiving a high or a low level of light. Assuming that the level of the voltage $V_1$ is indicative of the transistor 34 receiving a high level of light, the conduction of the transistor 38 is rapidly and alternately increased and decreased to drive the level of the voltage $V_1$ alternately above and below the first predetermined voltage level to maintain the average level of the voltage $V_1$ substantially equal to the first predetermined voltage level.

In the case where the voltage $V_1$ is indicative of the transistor 34 receiving a low level of light, the conduction of the transistor 38 is rapidly and alternately decreased and increased to drive the level of the image location voltage $V_1$ alternately below and above the level of the second predetermined voltage level to maintain the average level of the image location voltage $V_1$ substantially equal to the second predetermined voltage level.

The level of current generated by the transistor 38 is proportional to the level of charge on a capacitor 42 having a terminal 44 coupled to the base 46 of the transistor 38 through a resistor 48. The other terminal 49 of the capacitor is coupled to ground. The junction of the base 46 and the resistor 48 is also coupled to ground through a resistor 50 to provide a discharge path to ground for the capacitor 42. As is more fully described below, the level of charge on the capacitor 42 is alternately raised and lowered to change the level of conduction of the transistor 38 and, consequently, the level of the image location voltage $V_1$.

In the illustrated embodiment, an amplifier 52 receives the image location voltage $V_1$ at a positive input 54 and delivers at its output 56 the same voltage $V_1$ but at a lower impedance level. Hence, the amplifier 52 operates as a conventional voltage follower.

A bi-stable element 58 receives the voltage $V_1$ at a negative input terminal 60 for comparing the voltage $V_1$ with a selected voltage received at its positive input 62. As shown, the input 62 is coupled to a 6 volt source via a resistor 64, a 6 volt source being chosen because, for this partiular embodiment, 6 volts is intermediate the first and second desired predetermined voltage levels for the image location voltage, i.e., 8 volts and 4 volts, respectively. in other environments, a selected voltage other than 6 volts may be used but the selected voltage will, in any case, be intermediate the first and second predetermined voltage levels.

The positive input 62 of the bi-stable element 58 is coupled through a resistor 66 to the output terminal 68 of the bi-stable element 58, thereby permitting the bi-stable element 58 to act as a Schmitt trigger. Accordingly, whenever the voltage $V_1$ is positive with respect to 6 volts, (indicative of the transistor 34 receiving a relatively high level of light), the bi-stable element 58 will develop at its output terminal 68 a low level signal indicative of the condition of the voltage $V_1$. Conversely, when the voltage $V_1$ is lower than 6 volts, the bi-stable element 58 will develop at its output terminal 68 a relatively high level signal indicative of the condition of the voltage $V_1$. In addition to bi-stable element 58 generating signals at its output terminal 68 representative of the condition of the voltage $V_1$ and, therefore, also indicative of the relative amount of light received by the transistor 34, the voltage at the output 68 of the bi-stable element 48 also serves to vary the conduction of the transistor 38 in a manner to be hereinafter described. Toward the end, the output 68 of the bi-stable element 58 is coupled to the capacitor 42 via a resistor 69.

The voltage $V_1$ appearing at the output terminal 56 of the amplifier 52 is coupled to a positive input terminal 70 of a second bi-stable element 72 via a resistor 74. A negative input terminal 76 of the bi-stable element 72 receives a first control voltage, indicated as 8 volts, which is equal to the desired first predetermined level of the image location voltage. The output 78 of the bi-stable element 72 is coupled to its input 70 via a resistor 80 for enabling the bi-stable element 72 to operate as a Schmitt trigger. Consequently, the bi-stable element 72 delivers at its output 78 a relatively high level signal when the voltage $V_1$ at its input 70 exceeds 8 volts and a relatively low level signal when the voltage at its input 70 is below 8 volts.

The output of the bi-stable element 72 is coupled to a switch 82 which is responsive to a relatively high level signal at the output terminal 78 of the bi-stable element 72 for coupling a charging potential, indicated herein as 12 volts, through a resistor 84 to the terminal 44 of the capacitor 42. Thus, when the switch 82 is closed by the operation of the bi-stable element 72, the capacitor 42 is charged, the conduction of the transistor 38 increases, and the level of the image location voltage $V_1$ decreases.

To ensure that the capacitor 42 is charged by the operation of the switch 82, the resistor 84 should be much lower in ohmic value than the resistor 48 so that the capacitor 42 can be charged at a rate faster than its rate of discharge through the resistor 48. Further the ohmic value of the resistor 69 should be much greater than the ohmic value of resistors 48 or 84 so that the charging of capacitor 42 by the switch 82 is isolated from the discharging effect of the bi-stable element 58. Under these conditions, the bi-stable element 58 will attempt to continuously discharge the capacitor 42 when the voltage $V_1$ exceeds 6 volts. However, when the voltage $V_1$ exceeds 8 volts, the bi-stable element 72 and the switch 82 charge the capacitor when the voltage $V_1$ exceeds 8 volts, thus overriding the discharging of the capacitor 42 by the bi-stable element 58. Accordingly, the combination of the bi-stable element 72 and the switch 82 co-operate with the bi-stable element 58 to alternately charge and discharge the capacitor 42 when the voltage $V_1$ is at a level which is indicative of a high level of light being received by the transistor 34.

When the voltage $V_1$ drops below 6 volts as a result of the transistor 34 receiving less light, the bi-stable element 58 generates a relatively high level signal at its output 68 for charging the capacitor 42 through the resistor 69. To effect discharging of the capacitor 42 when the voltage $V_1$ is at a low level, a third bi-stable element 86 receives the voltage $V_1$ at its negative input terminal 88 and receives a second control voltage at its positive input 90. The second control voltage is indicated herein as 4 volts and is coupled to the input 90 of the bi-stable element 86 via a resistor 92. By virtue of a resistor 94 coupling the input 90 of the bi-stable element 86 to its output terminal 96, the bi-stable element 86 also acts as a Schmitt trigger. As a consequence of the connections shown, the bi-stable element 86 develops at its output terminal 96 a relatively low level signal when the voltage $V_1$ exceeds 4 volts and develops a relatively high level signal at its output 96 when the voltage $V_1$ is below 4 volts.

A second switch 98 receives the output of the bi-stable element 86 and, in response to a high level signal being generated at the output terminal 96, closes and couples the terminal 44 of the capacitor 42 to ground through a resistor 100 whose ohmic value is much less than the ohmic value of the resistor 48 in order to quickly discharge the capacitor 42. Thus, the combination of the bi-stable element 86 and the switch 98 serve to discharge the capacitor 42 when the level of the voltage $V_1$ is below 4 volts. As a result, when the voltage $V_1$ is indicative of the transistor 34 receiving a relatively low level of light, the switch 98 and the bi-stable element 58 alternately effect discharging and charging of the capacitor 42, all of which is more fully described below.

In operation, assuming that the transistor 34 is receiving a fairly high level of light, the voltage $V_1$ at the output 56 of the amplifier 52 will be at a relatively high level, 7 volts, for example. Under this condition, the bi-stable element 58 will develop at its output 68 a low level signal to permit the capacitor 42 to discharge to ground through the resistor 48. A portion of the charge on the capacitor 42 will also flow to ground through the resistor 69 which couples the capacitor 42 to the output 68 of the bi-stable element 58. Consequently, the voltage on the base 46 of the resistor 38 is decreased, thereby decreasing its conduction and allowing the voltage $V_1$ to rise.

When the voltage $V_1$ rises above 8 volts, the bi-stable element 72 develops a high level charging signal at its output terminal 78 for actuating the switch 82. In response to the high level signal generated by the bi-stable element 72, the switch 82 closes and thereby couples the capacitor 42 to the plus 12 volts supply through the resistor 84.

With the capacitor 42 now being charged through the resistor 84, the voltage at the base 46 of the transistor 38 increases, thereby increasing the conduction of the transistor 38 and lowering the voltage $V_1$ to 8 volts or somewhat lower. When the voltage $V_1$ reaches approximately 8 volts, the bi-stable element 72 develops a low level signal at its output 78 for opening the switch 82, thereby ceasing the charging of the capacitor 42. Because the voltage $V_1$ still exceeds the voltage present at the input 60 of the bi-stable element 58, its output still remains low to permit the capacitor 76 to discharge. Consequently, the capacitor 42 now discharges so as to lower the level of conduction of the transistor 38 and increase the level of the voltage $V_1$.

When the voltage again exceeds the 8 volt control voltge appearing at the input 76 of the bi-stable element 72, the bi-stable element 72 will again generate a relatively high level signal at its output 78 for again closing the switch 82. As a result, the capacitor 42 will again be charged through the resistor 84 for increasing the conduction of the transistor 38 and lowering the level of the voltage $V_1$ below 8 volts. The cycle of discharging and charging the capacitor 42 continues in the manner described above so as to maintain the average level of the voltage $V_1$ substantially equal to the first predetermined voltage level, 8 volts in this example.

The effect of the alternate charging and discharging of the capacitor 42 is shown in FIGS. 4A and 4B wherein FIG. 4A illustrates the level of light received by the transistor 34 and FIG. 4B illustrates the voltage $V_1$. Referring to FIG. 4A, the portion 104 of the illustrated waveform represents the condition wherein the transistor 34 is receiving a high level of light. The corresponding portion 106 of the waveform shown in FIG. 4B indicates how the level of the voltage $V_1$ is alternately decreased and increased by the operation of the bi-stable element 58 and the combined operation of the bi-stable element 72 and its switch 82. As shown, the average level of the voltage $V_1$ is maintained at 8 volts while the instantaneous value of the voltage $V_1$ alternately decreases and increases about the 8 volt level. Thus, the control system maintains the average level of the voltage $V_1$ at 8 volts despite changes in the current of the transistor 34 due to drifts of component values or changes in ambient conditions.

Assume now that an image interrupts the impingement of light on the transistor 34 such that the voltage $V_1$ falls to a level below 6 volts. Under this condition, the bi-stable element 58 will generate a relatively high level signal at its output terminal 68 for charging the capacitor 42 through the resistor 69. Accordingly, the conduction of the transistor 38 will increase and the voltage $V_1$ will decrease. When the voltage $V_1$ decreases below the level of the second control voltage at which the input 90 of the bi-stable element 86 is held (4 volts in this embodiment), the bi-stable element 86 will generate at its output 96 a relatively high level discharging signal which actuates the switch 98 for discharging the capacitor 42 through the switch 98, the resistor 100, and thence to ground. Consequently, the level of conduction of the transistor 38 decreases, and the level of the voltage $V_1$ increases toward 4 volts. When the voltage $V_1$ reaches 4 volts or slightly more, the bi-stable element 86 turns off, the switch 98 opens, and the capacitor 42 resumes charging through the resistor 69 by virtue of the high output which is still being generated by the bi-stable element 58.

When the capacitor 42 charges sufficiently to increase the conduction of the transistor 38 to the point where the voltage $V_1$ again decreases slightly below 4 volts, the bi-stable element 86 will again turn on and generate at its output 96 a relatively high level signal for actuating the switch 98 and again discharging the capacitor 42 in order to decrease the conduction of the transistor 38 and raise the level of the voltage $V_1$ above 4 volts. This cycle continuously repeats while the transistor 34 is receiving a relatively low level of light.

Referring again to FIG. 4, the above described sequence of events is illustrated by portion 108 of the waveform shown in FIGS. 4A and portion 110 of the waveform $V_1$ shown in FIG. 4B. As indicated, the voltage $V_1$ alternately rises above and decreases below the 4 volt control level so that the average value of the voltage $V_1$ is maintained substantially at 4 volts.

The signal output of the bi-stable element 58 is indicated in FIG. 4C. Because the ripples on the voltage $V_1$ do not cross the 6 volt level to which the positive input 62 of the bi-stable element 58 is held, the output of the bi-stable element 58 changes only when the current output of the transistor 34 changes drastically. Thus, the output of the bi-stable element 58 may be coupled to a pulse sensing circuitry for counting the number of pulses to give an indication of the number of images which interrupt the light to the transistor 34.

As shown in FIg. 3, the output of the bi-stable element 58 may be coupled to a driver transistor 110 having an output terminal 112. FIG. 4D illustrates the signal appearing on the output terminal 112.

The control system described above operates to maintain the image location voltage at first and second predetermined levels despite variations in component values or ambient conditions. It is particularly well suited for use in microfilm readers in which a film bearing images is transported along a path between a light source and a photosensitive device. The photosensitive device will respond to the differences in light transmission between the film itself and the images thereon for developing a current indicative of the presence or absence of an image in the light path. The control system described above will convert the current from the photosensitive device to an image location voltage and hold that voltage between first and second predetermined levels.

Alternately, the microfilm reader may be of the type wherein the light received by the photosensitive device is reflected by the film. In the latter case, the control system will be substantially the same as described.

Although the invention has been described in terms of a specific embodiment, it will be apparent to those skilled in the art that many modifications and alterations may be made to the disclosed embodiment without departing from the spirit and scope of the invention. Accordingly, it is intended that all such modifications and alterations be included within the spirit and scope of the invention as defined by the appended claims.

What is claimed is:

1. In an image detector having a light source, a light sensitive element disposed to receive light generated by the light source for generating a current proportional to the level of light incident thereon, and an image path along which an image bearing element is conveyed adjacent the light sensitive element for varying the light incident upon the light sensitive element in response to the presence and absence of an image, a control system for generating an image location voltage of a first predetermined level in the absence of an image and an image location voltage of a second predetermined level in the presence of an image, the control system comprising:
  impedance means receiving the current from the photosensitive element for generating an image location voltage;
  a variable current source having an output coupled to said impedance means and an input;
  a charge storing element coupled to the input of said variable current source, said variable current source generating a current proportional to the level of charge on said charge storing element for varying its current output and thereby the level of said image location voltage;
  first means responsive to the image location voltage exceeding a selected voltage level intermediate the intended first and second predetermined levels for discharging said charge storing element and raising the level of the image location voltage above the first predetermined level, and responsive to the image location voltage being below the selected voltage level for charging said charge storing element and lowering the level of the image location voltage below the second predetermined level;
  second means responsive to the image location voltage exceeding the first predetermined level for charging said charge storing element and lowering the image location voltage below the first predetermined level;
  third means responsive to the image location voltage being below the second predetermined level for discharging said charge storing element and raising the image location voltage above the second predetermined level,
  whereby, when the image location voltage is intermediate the selected voltage level and the first predetermined level, said first means discharges said charge storing element and raises the image location voltage above said first predetermined level, whereupon said second means and said first means then alternately charge and discharge said charge storing element for alternately lowering and raising the image location voltage about the first predetermined level, and when the image location voltage is intermediate the selected voltage level and the second predetermined level, said first means charges the charge storing element to lower the level of the image location voltage below the second predetermined level, whereupon said third means and said first means alternately discharge and charge said charge storing element for alternately raising and lowering the image location voltage about the level of the second predetermined level to maintain the average level of the image location voltage substantially equal to the second predetermined level.

2. A control system as set forth in claim 1 wherein said first means continuously discharges said charge storing element when the image location voltage exceeds the selected voltage level and continuously charges said charge storing element when the image location voltage is below the selected voltage level, wherein said second means charges said charge storing element at a rate exceeding the rate at which said first means discharges said charge storage element, and wherein said third means discharges said charge storing element at a rate exceeding the rate at which said first means charges said charge storing element.

3. In an image detector having a light source, a light sensitive element disposed to receive light generated by the light source for generating a current proportional to the level of light incident thereon, and an image path along which an image bearing element is conveyed adjacent the light sensitive element for varying the light incident upon the light sensitive element in response to the presence and absence of an image, a control system for generating an image location voltage of a first predetermined level in the absence of an image and an image location voltage of a second predetermined level in the presence of an image, the control system comprising:
  impedance means receiving the current from the photosensitive element for generating an image location voltage;
  a variable current source having an output coupled to said impedance means and an input;
  a charge storing element coupled to the input of said variable current source, said variable current source generating a current proportional to the level of charge on said charge storing element for varying its current output and thereby the level of said image location voltage;
  first means responsive to the image location voltage exceeding a selected voltage level intermediate the intended first and second predetermined levels for discharging said charge storing element, thereby reducing the current generated by said current source and raising the level of the image location voltage;
  second means for generating first and second control voltages equal, respectively, to the first and second predetermined voltage levels;
  third means responsive only to the image location voltage exceeding said first control voltage for charging said charge storing element, thereby increasing the current generated by said current source and lowering the image location voltage, whereby when said image location voltage exceeds said selected voltage level said first and third means alternately discharge and charge said element to drive the image location voltage alternately above and below said first control voltage to maintain the average level of the image location voltage substantially equal to the level of said first control voltage;
  said first means being further responsive to the image location voltage being lower than said selected voltage level for charging said charge storing element, thereby increasing the current generated by said current source and lowering the image location voltage; and
  fourth means responsive only to the image location voltage being lower than said second control voltage for discharging said charge storing element, thereby decreasing the current generated by said current source and raising the image location voltage, whereby when said image location voltage is lower than said selected voltage said first and fourth means alternately charge and discharge said element to drive the image location voltage alternately below and above said second voltage level to maintain the average level of the image location voltage equal to the level of said control voltage.

4. A control system as set forth in claim 3 wherein said first means includes a first bi-stable element having a first input held to said selected voltage level, a second input receiving said image location voltage, and an output coupled to said charge storing element, whereby when said image location voltage exceeds said selected voltage level, the output of said bi-stable element is conditioned to discharge said charge storing element, and when the level of said image location voltage is lower than said selected voltage level the output of said bi-stable element is conditioned to charge said charge storing element.

5. A control system as set forth in claim 3 wherein said third means includes a second bi-stable element having a first input receiving said image location voltage, a second input receiving said first control voltage, and an output, said second bi-stable element generating at its output a charging signal in response to said image location voltage exceeding said first control voltage.

6. A control system as set forth in claim 5 wherein said third means further includes a switch coupled between said charge storing element and a source of charging voltage, said switch being responsive to the charging signal generated by said second bi-stable element for coupling said charge storing element to the source of charging voltage.

7. A control system as set forth in claim 3 wherein said fourth means includes a third bi-stable element having a first input receiving the image location voltage, a second input receiving the secong control voltage, and an output, said third bi-stable element generating at its output a discharging signal in response to the image location voltage being lower than the second control voltage.

8. A control system as set forth in claim 7 wherein said fourth means further includes a switch coupled between the charge storing element and a discharging potential, said switch being responsive to the discharging signal generated by said third bi-stable element for coupling said charge storing element to the discharging potential.

9. In an image detector having a light source, a light sensitive element disposed to receive light generated by the light source for generating a current proportional to the level of light incident thereon, and an image path along which an image bearing element is conveyed adjacent the light sensitive element for varying the light incident upon the light sensitive element in response to the presence and absence of an image, a control system for generating an image location voltage of a first predetermined level in the absence of an image and an image location voltage of a second predetermined level in the presence of an image, the control system comprising:

impedance means receiving the current from the photosensitive element for generating an image location voltage;

a variable current source including a transistor having a collector terminal coupled to said impedance means, an emitter terminal coupled to ground, and a base terminal, said current source operating to selectively vary the current through said impedance to vary the level of the image location voltage;

a capacitor having a first terminal coupled to the base of said transistor and a second terminal coupled to ground;

a first impedance coupled across the terminals of said capacitor to provide a discharge path therefor;

a bi-stable element having a first input held to a selected voltage level intermediate the intended first and second predetermined levels, a second input receiving said image location voltage, and an output, said bi-stable element generating at its output a capacitor discharging potential in response to the image location voltage exceeding the selected voltage level, and generating a capacitor charging potential in response to the image location voltage being lower than the selected voltage level;

a second impedance coupling the output of said bi-stable element to the first terminal of said capacitor, whereby when the image location voltage is at a level between the first predetermined level and the selected level, said bi-stable element generates a capacitor discharging potential to permit said capacitor to discharge through said first impedance, reduce the current generated by said transistor, and raise the level of the image position voltage above the first predetermined voltage level;

first means for generating first and second control voltages equal, respectively, to the first and second predetermined voltage levels;

second means receiving the first control voltage and the image location voltage for charging said capacitor in response to the image location voltage exceeding the first control voltage, thereby increasing the current generated by said transistor and lowering the image location voltage, whereby when the photosensitive device receives sufficient light to raise the image location voltage to a level between the selected voltage and the first predetermined voltage level, said bi-stable element generates a capacitor-discharging potential for discharging said capacitor and raising the image location voltage above the level of the first predetermined voltage level, whereupon said bi-stable element and said second means then alternately discharge and charge said capacitor, respectively, to drive the image location voltage alternately above and below said first predetermined voltage level to maintain the average level of the image location voltage substantially equal to the first predetermined voltage level;

third means receiving the second control voltage and the image location voltage for discharging said capacitor in response to the image location voltage being lower than the second control voltage, whereby when the photosensitive device receives a reduced amount of light such that the image location voltage is reduced to a level between the selected voltage and the second predetermined voltage level, said bi-stable element generates a capacitor-discharging potention for charging said capacitor and lowering the image location voltage below said second predetermined voltage level, whereupon said bi-stable element and said third means then alternately charge and discharge said capacitor, respectively, to drive the image location voltage alternately below and above said second predetermined voltage level to maintain the average level of the image location voltage substantially equal to the second predetermined voltage level.

10. A control system as set forth in claim 9 wherein said second means includes a second bi-stable element having a first input receiving the image location voltage, a second input receiving the first control voltage, and an output, said second bi-stable element generating at its output a charging signal in response to said image location voltage exceeding the first control voltage.

11. A control system as set forth in claim 10 wherein said second means further includes a switch coupled between the first terminal of said capacitor and a source of charging voltage, said switch being responsive to the charging signal generated by said second bi-stable element for coupling the first terminal of said capacitor to the source of charging voltage.

12. A control system as set forth in claim 9 wherein said third means includes a third bi-stable element having a first input receiving the image location voltage, a second input receiving the second control voltage, and an output, said third bi-stable element generating at its output a discharging signal in response to the image location voltage being lower than the second control voltage.

13. A control system as set forth in claim 12 wherein said third means further includes a switch coupled between the first terminal of said capacitor and ground, said switch being responsive to the discharging signal generated by said third bi-stable element for coupling the first terminal of said capacitor to ground.

14. In an image detector having a light source, a light sensitive element disposed to receive light generated by the light source for generating a current proportional to the level of light incident thereon, and an image path along which an image bearing element is conveyed adjacent the light sensitive element for varying the light incident upon the light sensitive element in response to the presence and absence of an image, a control system for generating an image location voltage of a first predetermined level in the absence of an image and an image location voltage of a second predetermined level in the presence of an image, the control system comprising:

impedance means receiving the current from the photosensitive element for generating an image location voltage;

a variable current source including a transistor having a collector terminal coupled to said impedance means, an emitter terminal coupled to ground, and a base terminal, said current source operating to selectively vary the current through said impedance to vary the level of the image location voltage;

a capacitor having a first terminal coupled to the base of said transistor and a second terminal coupled to ground;

a first impedance coupled across the terminals of said capacitor to provide a discharge path therefor;

a first bi-stable element having a first input held to a selected voltage level intermediate the intended first and second predetermined levels, a second input receiving said image location voltage, and an output, said bi-stable element generating at its output a capacitor discharging potential in response to the image location voltage exceeding the selected voltage level, and generating a capacitor charging potential in response to the image location voltage being lower than the selected voltage level;

a second impedance coupling the output of said bi-stable element to the first terminal of said capacitor, whereby when the image location voltage is at a level between the first predetermined level and the selected level, said bi-stable element generates a capacitor discharging potential to permit said capacitor to discharge through said first impedance, reduce the current generated by said transistor, and raise the level of the image position voltage above the first predetermined voltage level;

first means for generating first and second control voltages equal, respectively, the the first and second predetermined voltage levels of the image location voltage;

a second bi-stable element having a first input receiving the image location voltage, a second input receiving the first control voltage, and an output, said second bi-stable element generating at its output a charging signal in response to the image location voltage exceeding the first control voltage;

a first switch coupled between the first terminal of said capacitor and a source of charging voltage, said switch being responsive to the charging signal generated by said second bi-stable element for coupling the first terminal of said capacitor to the source of charging voltage, thereby charging said capacitor, increasing the current generated by said transistor and lowering the image location voltage, whereby when the photosensitive device receives sufficient light to raise the image location voltage to a level between the selected voltage and the first predetermined voltage level, said first bi-stable element and said first switch alternately discharge and charge said capacitor, respectively, to drive the image location voltage alternately above and below said first predetermined voltage level to maintain the average level of the image location voltage substantially equal to the first predetermined voltage level;

a third bi-stable element having a first input receiving the image location voltage, a second input receiving the second control voltage, and an output, said third bi-stable element generating at its output a discharging signal in response to the image location voltage being lower than the second control voltage;

a second switch coupled between the first terminal of said capacitor and ground, said second switch being responsive to the discharging signal generated by said third bi-stable element for coupling the first terminal of said capacitor to ground, thereby discharging said capacitor, decreasing the current generated by said transistor and raising the image location voltage, whereby when the photosensitive device receives a reduced amount of light such that the image location voltage is reduced to a level between the selected voltage and the second predetermined voltage level, said first bi-stable element and said second switch alternately charge and discharge said capacitor, respectively, to drive the image location voltage alternately below and above said second predetermined voltage level to maintain the average level of the image location voltage substantially equal to the second predetermined voltage level.

* * * * *